United States Patent
Clark et al.

(10) Patent No.: US 6,639,827 B2
(45) Date of Patent: Oct. 28, 2003

(54) LOW STANDBY POWER USING SHADOW STORAGE

(75) Inventors: Lawrence T. Clark, Phoenix, AZ (US); Franco Ricci, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/097,202

(22) Filed: Mar. 12, 2002

(65) Prior Publication Data

US 2003/0174534 A1 Sep. 18, 2003

(51) Int. Cl.[7] .............................................. G11C 11/00
(52) U.S. Cl. .................. 365/154; 365/227; 365/223.06; 365/189.11
(58) Field of Search ........................... 365/227, 230.06, 365/185.23, 189.11, 190, 203, 154, 229; 327/432, 535, 537, 543

(56) References Cited

U.S. PATENT DOCUMENTS

| | | | | | |
|---|---|---|---|---|---|
| 5,226,014 A | * | 7/1993 | McManus | .................... | 365/210 |
| 5,303,190 A | * | 4/1994 | Pelley, III | .............. | 365/189.11 |
| 5,668,770 A | * | 9/1997 | Itoh et al. | .................... | 365/227 |
| 5,894,433 A | * | 4/1999 | Itoh et al. | .................... | 365/154 |
| 6,469,950 B2 | * | 10/2002 | Itoh et al. | .................... | 365/227 |

\* cited by examiner

*Primary Examiner*—Huan Hoang
*Assistant Examiner*—Gene N. Auduong
(74) *Attorney, Agent, or Firm*—Blakely, Sokoloff, Taylor & Zafman LLP

(57) ABSTRACT

An integrated circuit having CMOS transistors processed with different gate-oxide thicknesses. The transistors having the thinner gate-oxide may be used to generate data values that may be stored by the transistors having the thicker gate-oxides. The thicker gate-oxides may reduce gate leakage currents during a system standby mode.

25 Claims, 4 Drawing Sheets

500

LOW STANDBY POWER USING SHADOW STORAGE

As memory arrays are embedded into the microprocessors that are used in a diversity of consumer products, the trend toward portable products suggests conserving power by lowering the operating voltage of the electronic devices. Additionally, process scaling may be used to reduce the area needed for the memory array and logic functions in an effort to lower the product costs. However, process scaling poses problems, especially at the low operating voltage potentials, that may result in high leakage currents and high standby power consumption. As the process is scaled, of particular importance is the thin gate-oxide of transistors used in memories, latches and logic used to store state values.

The thin gate-oxides may cause large drain-to-source currents and gate leakage currents that may be appreciable during a standby mode. Thus, there is a continuing need for better ways to provide flexibility for operating a microprocessor, memory or other circuit having thin gate-oxides while preserving low standby currents.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
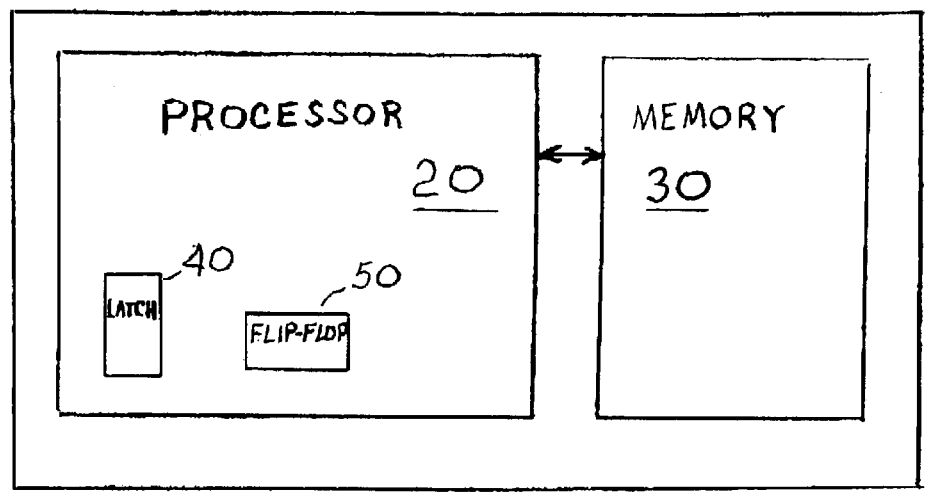
FIG. 1 is a block representation of a microprocessor core and memory block in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the present invention may be used in a variety of applications. Although the present invention is not limited in this respect, the circuits disclosed herein may be used in microcontrollers, general-purpose microprocessors, Digital Signal Processors (DSPs), Reduced Instruction-Set Computing (RISC), Complex Instruction-Set Computing (CISC), among other electronic components. However, it should be understood that the scope of the present invention is not limited to these examples.

Embodiments of the present invention may also include integrated circuit blocks referred to as core memory, cache memory, or other types of memory that store electronic instructions to be executed by the microprocessor or store data that may be used in arithmetic operations. In general, an embodiment for storage of a data logic value using thick gate-oxide transistors may provide a benefit to microprocessors. Specifically, an embodiment for a Static Random Access Memory (SRAM) memory device may benefit from using the present invention to reduce standby power consumption. Note that the embodiments may be integrated into radio systems or hand-held portable devices. Thus, laptop computers, cellular radiotelephone communication systems, two-way radio communication systems, one-way pagers, two-way pagers, personal communication systems (PCS), personal digital assistants (PDA's), cameras and other products are intended to be included within the scope of the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Also, in the following description and claims, the terms "thin gate-oxide" and "thick gate-oxide," along with their derivatives, may be used. The use of these terms implies the integration of at least two transistors, with the gate-oxide thickness of one transistor differing from the gate-oxide thickness of the second transistor, i.e., the two transistors are processed to intentionally have a different gate-oxide thickness. Thus, the adjectives "thin" and "thick" are used to make a distinction between transistors and to differentiate one group of transistors from another group of transistors. Used as such, the terms "thin" and "thick" are relative, not absolute terms.

Turning to FIG. 1, circuit 10 may be described having a microprocessor core 20 and a memory block 30. Address lines, control signals, and data may be passed from microprocessor core 20 to memory block 30. Memory block 30 may primarily be comprised of Static Random Access Memory (SRAM) cells, although this is not intended to limit the scope of the claimed subject mater, that may be arranged as one or more separate arrays or as a cache memory for microprocessor core 20. Data stored in memory block 30 may be "read" by sense amplifiers and supplied to microprocessor core 20. Circuit 10 may provide electrical connectivity for signals and operating voltages between devices external to circuit 10 and the internal blocks of microprocessor core 20 and memory block 30 such as, for example, a latch 40 and a flip-flop 50.

Figure 2:
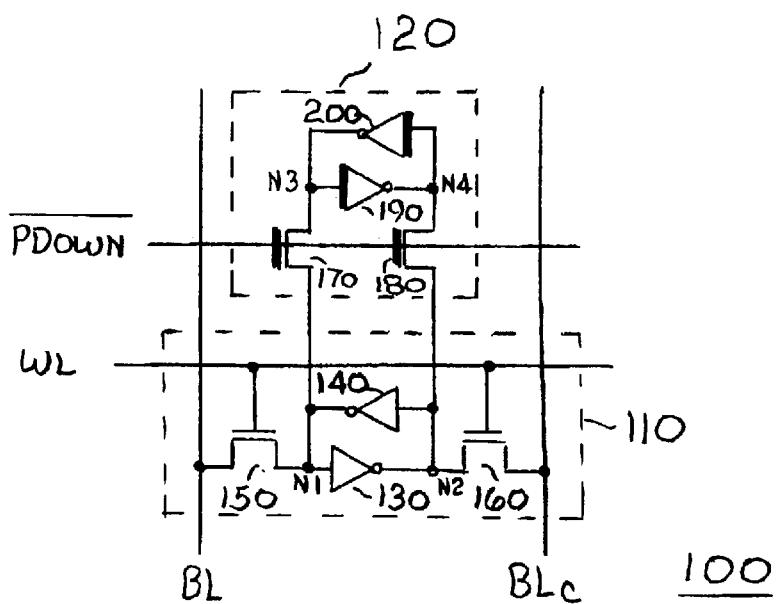
FIG. 2 is a schematic of a Static Random Access Memory (SRAM) memory cell used in the memory block of FIG. 1.

FIG. 2 is a schematic of a Static Random Access Memory (SRAM) memory cell that may illustrate one of the arrayed memory cells 100 in memory block 30. The memory cell may include a storage portion 110 and a shadow storage 120, both having N-channel and P-channel transistors arranged with cross-coupled Complementary Metal Oxide Semiconductor (CMOS) inverters. Specifically, storage portion 110 may include cross-coupled CMOS inverters 130 and 140 having inputs connected to their outputs. Data may be passed in and out of memory cell 100 from the bit line (BL) and the complement bit line ($BL_C$) by respective pass transistors 150 and 160, when enabled by a word line WL. Thus, the bit line data written into storage portion 110 may be stored on a node N1 and the complement bit line data may be stored on a node N2.

Shadow storage 120 may include cross-coupled CMOS inverters 190 and 200. Data may transfer between node N1 of storage portion 110 and node N3 of shadow storage 120 and data may transfer between node N2 of storage portion 110 and node N4 of shadow storage 120 when N-channel pass transistors 170 and 180 are enabled by the signal $\overline{PDOWN}$. The signal $\overline{PDOWN}$ may have a voltage potential of about 1.6 volts, although this is not a limitation of the present invention, that enables pass transistor 170 to transfer data signals between nodes N1 and N3 and pass transistor 180 to transfer data signals between nodes N2 and N4. In general, a desired logic high voltage for the signal $\overline{PDOWN}$ is $V_{CC}+V_{tn}$, where $V_{tn}$ is the threshold voltage of the thick gate NMOS transistor. The signal $\overline{PDOWN}$ may have a voltage value of about 0 volts when microprocessor core 20 is in the standby mode, causing pass transistors 170 and 180 to be nonconductive, and thereby, electrically isolate node N1 from node N3 and node N2 from node N4. It is assumed herein that the $V_{tn}$ of the thick gate-oxide transistors is higher than that of the thin gate-oxide transistors. Furthermore, "thick" implies a gate-oxide thickness that substantially eliminates the gate-oxide leakage current, such that the gate-oxide leakage current has a value less than approximately 1/100 of the source-to-drain leakage current.

The transistors of storage portion 110 may be processed to have a different gate-oxide thickness than the transistors of shadow storage 120. For instance, the transistors that comprise the cross-coupled inverters 190 and 200 and the pass transistors 170 and 180 may be processed with a gate-oxide that is thicker than the gate-oxide of the transistors that comprise the cross-coupled inverters 190 and 200 and pass transistors 170 and 180. Thus, the transistors of storage portion 110 are referred to as thin gate transistors and the transistors of shadow storage 120 are referred to as thick gate transistors.

Figure 3:
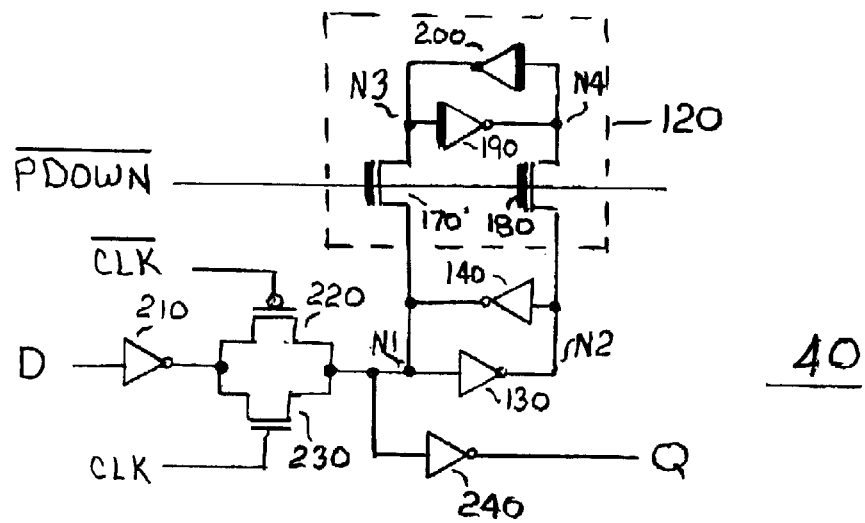
FIG. 3 is a schematic representation of a latch that may be used in the microprocessor core of FIG. 1.

FIG. 3 is a schematic representation of a latch 40 that may be used in microprocessor core 20 of FIG. 1. The reference numerals have been repeated in FIGS. 2 and 3 to indicate corresponding or analogous elements. In particular, inverters 130, 140, 190 and 200, and pass transistors 170 and 180 have a common connectivity relationship in the embodiments shown in FIGS. 2 and 3. However, it should be noted that the sizing of the transistors (physical gate width and length dimensions) are chosen by design and the transistor sizes of memory cell 100 may differ from the transistor sizes chosen for latch 40. In addition, latch 40 includes an inverter 210 that may receive a signal D and provide an inverted signal to a switch comprised of transistors 220 and 230. N-channel transistor 230 may be enabled by a signal CLK and P-channel transistor 220 may be enabled by a signal $\overline{CLK}$. The output of the switch is connected to the input of inverter 130. An inverter 240 is also connected to the input of inverter 130 at node N1 and generates an output signal Q of latch 40. Additional transistors may be present in the feedback thin gate inverter 140 to break the feedback and speed data writes as commonly practiced in the art.

The transistors of shadow storage 120 may be processed to have a different gate-oxide thickness than the other transistors in the embodiment shown in FIG. 3. The transistors that comprise the cross-coupled inverters 190 and 200 and the pass transistors 170 and 180 may be processed with a gate-oxide that is thicker than the gate-oxide of the other transistors. The transistors of shadow storage 120 may be referred to as thick gate transistors.

In operation, the state of latch 40 may be written and stored into shadow storage 120 by the assertion of the signal $\overline{PDOWN}$. The signal $\overline{PDOWN}$ may then be de-asserted and power removed from the logic portion that causes loss of the state information in the logic portion. When power is reapplied, while the signal $\overline{PDOWN}$ is asserted, the state value stored in shadow storage 120 sets the state of the latch during the power up.

Figure 4:
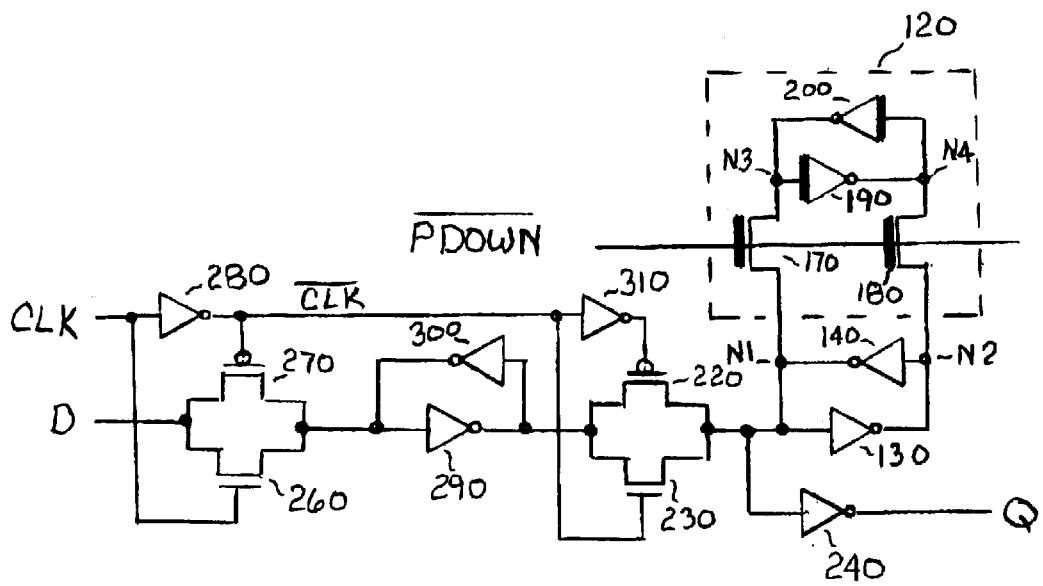
FIG. 4 is a schematic representation of a flip-flop that may be used in the microprocessor core of FIG. 1.

FIG. 4 is a schematic representation of a master-slave flip-flop 50 that may be used in microprocessor core 20 of FIG. 1. The master portion of flip-flop 50 may include a switch provided by transistors 260 and 270. N-channel transistor 260 may be enabled by a signal CLK and P-channel transistor 270 may be enabled by a signal $\overline{CLK}$ as generated by an inverter 280. The output of the switch may be connected to the cross-coupled inverters 290 and 300.

The slave portion of flip-flop 50 includes a switch comprised of transistors 220 and 230, along with inverters 130, 140, 190, 200 and 240, and pass transistors 170 and 180. Although these inverters and pass transistors may have a connectivity similar to corresponding transistors illustrated in the embodiment shown in FIG. 3, it should be pointed out that the transistor sizes may differ. Again, the transistors of shadow storage 120 may be processed to have a different gate-oxide thickness than other transistors shown in the embodiment illustrated in FIG. 4. The transistors of shadow storage 120 may be referred to as thick gate transistors. It is important to note that the thick gate storage may be provided for the master portion or the slave portion only and still allow proper operation.

Figure 5:
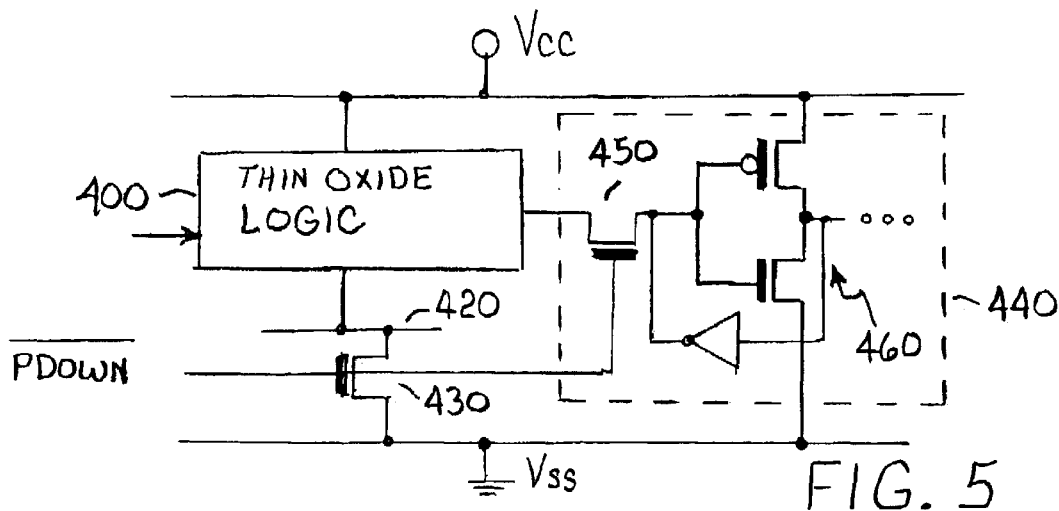
FIG. 5 is a diagram that illustrates the general partitioning of transistors into thin and thick gate-oxide logic sections.

FIG. 5 is a diagram that illustrates the general partitioning of transistors into thin and thick gate-oxide logic sections. Block 400 is a thin gate-oxide logic section coupled between a power conductor having a reference voltage $V_{CC}$ and a virtual ground 420. Logic block 400 may include logic gates such as inverters, NOR-gates, NAND-gates, exclusive-OR gates, exclusive-NOR gates that may, in general, be used singularly or in combination. By way of example, the combined logic gates may be memory cells, multipliers, adders, data shifters, state machines, encoding/decoding functions, Application Specific Integrated Circuits (ASICs), among others, although these examples are not intended to limit the claimed subject matter. The thin gate-oxide transistors within logic block 400 generate a result that may be captured and stored by the thick gate-oxide transistors within logic block 440.

An N-channel transistor 430 may be coupled between virtual ground 420 and a power conductor having a reference voltage of $V_{SS}$. Transistor 430 is a thick gate-oxide device that may receive a signal $\overline{PDOWN}$ having a value of about 1.6 volts when processor core 20 operates in the active mode and about 0 volts when operating in the standby mode, although these values are not intended to be limiting to the claimed subject matter. In the standby mode, transistor 430 is nonconductive and virtual ground 420 may float to about the $V_{CC}$ voltage potential. However, in the active mode, transistor 430 is conductive and virtual ground 420 substantially matches the reference voltage potential $V_{SS}$. The output signals generated in accordance with the logic configured within logic block 400 may be captured and stored within logic block 440. Any leakage current from the thin gate-oxide transistors in logic block 400 passes through transistor 430, a non-leaky device.

It should be pointed out that logic block 440 typically is not used in high frequency switching applications or exposed to high voltages. Rather, logic block 440 may be used to save a state value that is used by processor 20. Thus, this embodiment of the present invention may be used to provide a checkpoint as a record of the complete state of a simulation. Checkpoints may be included so that program runs, which have been interrupted by machine failure, or halted because a user's time slot has expired, can be resumed. An interactive command may re-load a checkpoint file, and the resume command may re-start execution of processor 20. Additionally, low frequency logic, e.g. real time clock wakeup logic, etc., may be implemented in the thick gate portion of the circuit.

Figure 6:
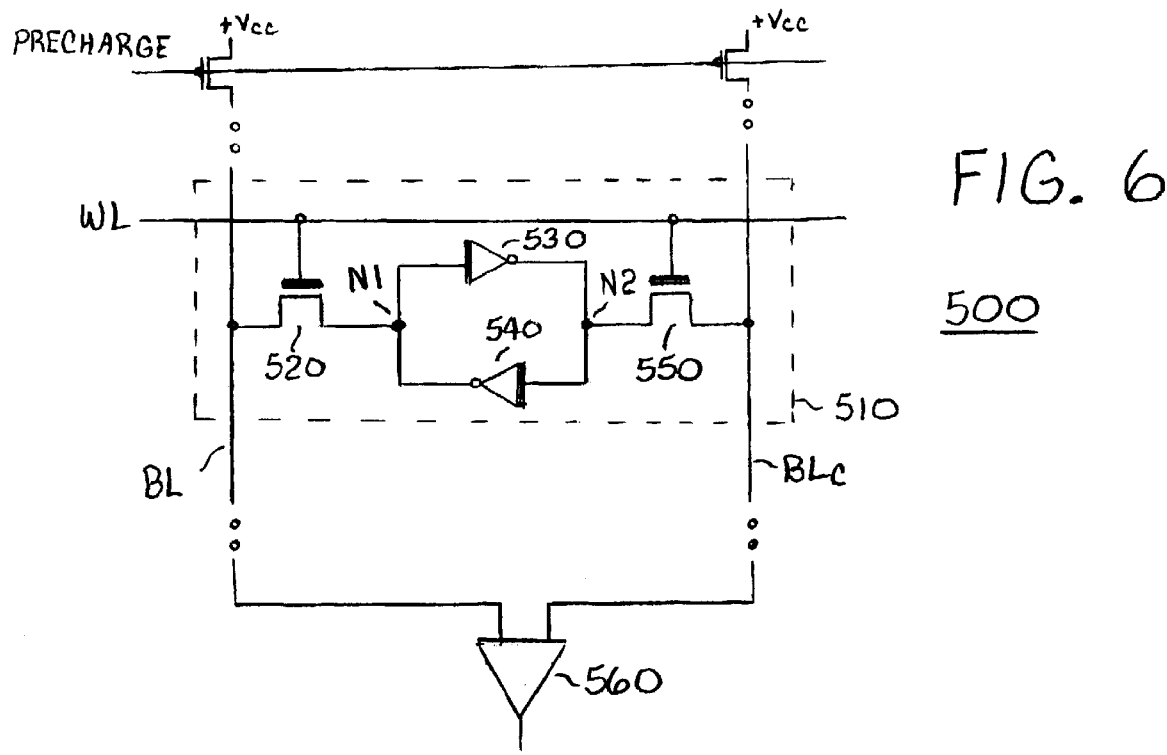
FIG. 6 is another embodiment of an SRAM memory that may be used in the memory block.

FIG. 6 is another embodiment of an SRAM memory 500 that may be used in memory block 30 (FIG. 1). SRAM memory 500 includes an arrayed memory cell 510, pre-charge devices to set voltage potentials on bit lines, and a sense amp 560. Data may be passed in and out of memory cell 510 from the bit line (BL) and the complement bit line (BL$_c$) by respective pass transistors 520 and 550, when enabled by a signal on the word line WL. Thus, the bit line data written into memory cell 510 may be stored on a node N1 and the complement bit line data may be stored on a node N2, with cross-coupled CMOS inverters 530 and 540 storing the memory cell data. Essentially, the thin gate portion may be disposed of, and the thick gate region may directly implement the only storage. A higher V$_{CC}$ (approximately 1.6 volts) may be applied.

The operating voltage of cross-coupled inverters 530 and 540 may be maintained at a fixed voltage value of about 1.6 volts to provide memory cell stability. The operating voltage supplied to the precharge transistors may be adjusted for performance, power, etc., and have an operating range of about 0.5 volts to about 1.2 volts. Cross-coupled CMOS inverters 530 and 540, and pass transistors 520 and 550 may be processed to have a thick gate-oxide thickness when compared to the gate-oxide thickness of other transistors, such as the transistors within sense amp 560. The gate leakage current (J$_{ox}$) of thick gate-oxide transistors is significantly less than the J$_{ox}$ of thin gate-oxide transistors. Thus, the thick gate-oxide transistors used in memory cell 510 provide a reduced gate leakage current and a lower power in a standby mode of operation.

Figure 7:
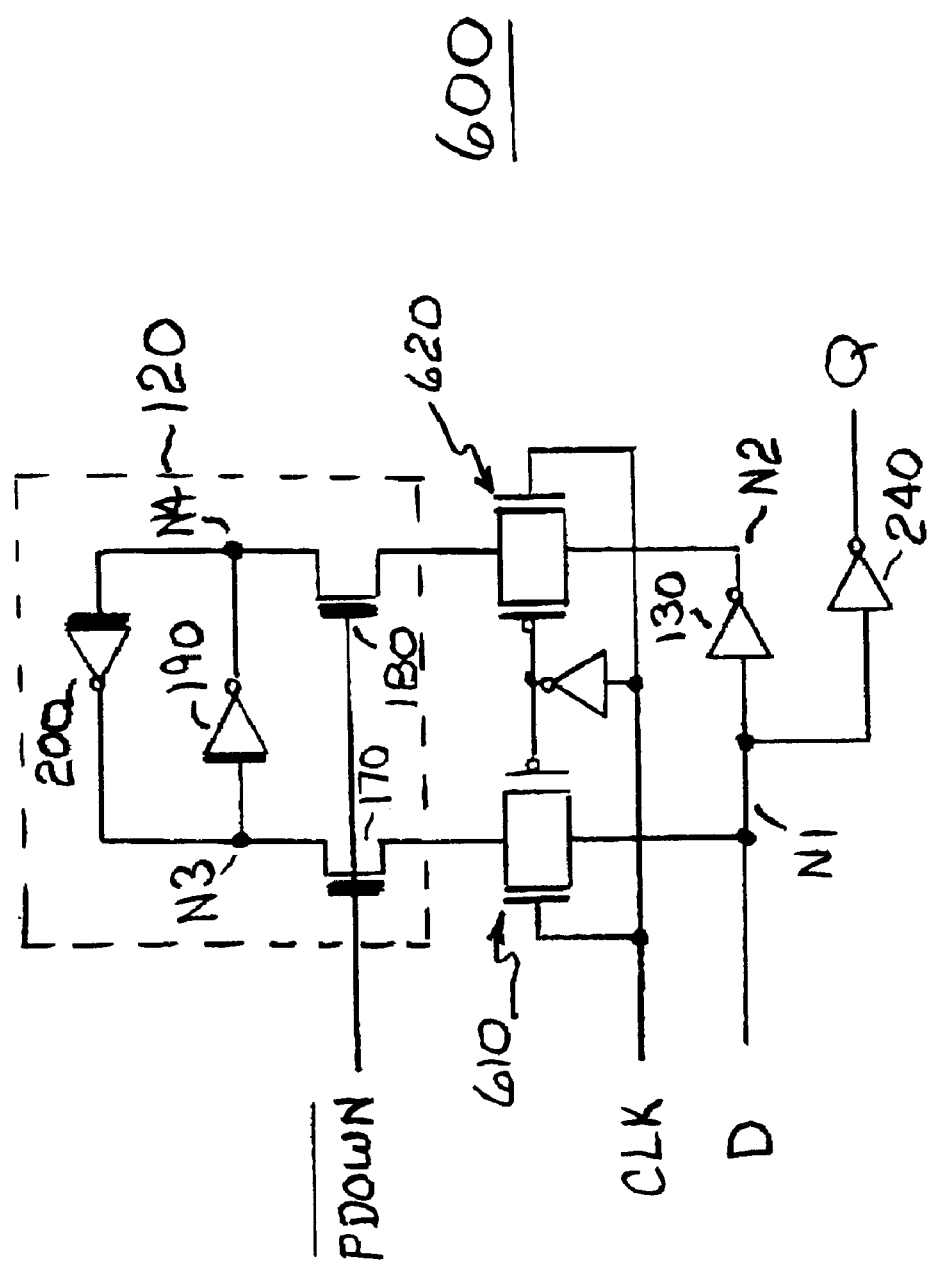
FIG. 7 illustrates another embodiment of a latch.

FIG. 7 illustrates another embodiment of a latch 600 having a shadow storage 120. Shadow storage 120 has cross-coupled CMOS inverters 190 and 200 and N-channel pass transistors 170 and 180. The cross-coupled inverters 190 and 200 store data received at nodes N3 and N4 that transfers from respective nodes N1 and N2. The data at nodes N1 and N2 is based on the input value D and an inverted data value generated by inverter 130. Data may be transferred to/from shadow storage 120 when N-channel pass transistors 170 and 180 are enabled by the signal $\overline{\text{PDOWN}}$ and switches 610 and 620 are conductive in accordance with the signal CLK.

Again, the transistors in shadow storage 120 may be processed with a gate-oxide that is thicker than the gate-oxide of the other transistors in latch 600. Typically, it should be pointed out that shadow storage 120 is not used in high frequency switching applications or exposed to high voltages. It should further be pointed out that latch 600 as presented in FIG. 7 may be modified to remove pass transistor 180, switch 620 and inverter 130. These devices are included to provide good operation when the operating potential V$_{CC}$ is reduced.

By now it should be clear that embodiments have been presented for storing state values in shadow storage that incorporate transistors processed with a thicker gate-oxide than the transistors configured for high frequency switching applications. In addition, embodiments have been presented for storing data values in memory cells having a thicker gate-oxide to provide a memory having reduced standby power consumption. The separate sections of thin and thick gate-oxide transistors may allow the microprocessor and the memory block to be integrated together and operate efficiently while satisfying different criteria.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A Complementary Metal Oxide Semiconductor (CMOS) circuit comprising:
   a first CMOS section to receive an input signal and provide an output signal, wherein transistors in the first CMOS section have a first gate-oxide thickness; and
   a second CMOS section integrated with the first CMOS section where transistors in the second CMOS section have a second gate-oxide thickness that differs from the first gate-oxide thickness, wherein the second CMOS section receives and stores the output signal.

2. The CMOS circuit of claim 1, wherein the second gate-oxide thickness is greater than the first gate-oxide thickness and the transistors in the second CMOS section have a higher threshold voltage than the transistors in the first CMOS section.

3. The CMOS circuit of claim 1, wherein the first CMOS section is a Static Random Access Memory (SRAM) cell and the second CMOS section is a shadow storage coupled to the SRAM cell, wherein the shadow storage includes cross-coupled inverters coupled through a transistor to receive the output signal from the first CMOS section.

4. The CMOS circuit of claim 1, wherein the first CMOS section is a latch coupled to receive the input signal and the second CMOS section is a shadow storage coupled to receive and store the output signal.

5. The CMOS circuit of claim 4, wherein the latch includes:
   an inverter coupled to receive the input signal and generate the output signal;
   a first switch to couple the input signal to the second CMOS section; and
   a second switch to couple the output signal to the second CMOS section, wherein the first and second switch are enabled together.

6. The CMOS circuit of claim 5, wherein the first CMOS section is a slave portion of a master-slave flip-flop.

7. A circuit, comprising:
   a memory cell having cross-coupled inverters for storing a data value and pass transistors for reading and writing the memory cell from a bit line, wherein the cross-coupled inverters and pass transistors have a first gate-oxide thickness; and
   transistors for a sense amp coupled to the bit line of the memory cell and having a second gate-oxide thickness that differs from the first gate-oxide thickness, wherein the sense amp receives the data value.

8. The circuit of claim 7, further comprising a precharge device to couple the bit line to a power conductor that receives a first voltage potential that is lower than a second voltage potential supplied to the sense amp.

9. The circuit of claim 7, wherein the memory cell is arrayed and all the cross-coupled inverters and pass transistors in the arrayed memory cells have the first gate-oxide thickness.

10. A circuit, comprising:
   a first CMOS section coupled between a virtual ground and a first power conductor to provide an output signal, wherein transistors in the first CMOS section have a first gate-oxide thickness;
   a transistor having conduction terminals to couple the virtual ground to a second power conductor; and
   a second CMOS section having a second gate-oxide thickness that differs from the first gate-oxide thickness, wherein the second CMOS section receives and stores the output signal.

11. The circuit of claim 10, wherein the transistor has the second gate-oxide thickness.

12. The circuit of claim 10, wherein the second CMOS section includes cross-coupled inverters to latch the output signal.

13. The circuit of claim 10, wherein the output signal stored in the latch is coupled through a switch to restore a state value in the first CMOS section.

14. The circuit of claim 13, wherein the switch is an N-channel transistor having the second gate-oxide thickness.

15. The circuit of claim 13, wherein the switch and the transistor receive an enabling signal.

16. A latch circuit, comprising:
   a thin gate-oxide portion to receive an input value and having a pass gate device with a thin gate-oxide to provide an output value; and
   a thick gate-oxide portion having a storage node to store the output value and having a thick gate-oxide transistor coupled to the pass gate device to receive the output value.

17. The latch circuit of claim 16, further including another pass gate device in the thin gate-oxide portion and another thick gate-oxide transistor in the thick gate-oxide portion to write the output value differentially to the storage node.

18. The latch circuit of claim 16, further including cross-coupled inverters coupled to the storage node in the thin gate-oxide portion of the latch circuit.

19. A method for reducing current in a system, comprising;
   generating a data value using circuitry having a first gate-oxide thickness; and
   storing the data value using cross-coupled inverters having a second gate-oxide thickness that is greater than the first gate-oxide thickness, wherein the data value is transferred from the circuitry to the cross-coupled inverters.

20. The method of claim 19, further comprising removing power from the circuitry when the system is in a standby mode.

21. The method of claim 20, wherein removing power from the circuitry further comprising using a transistor having the second gate-oxide thickness to provide a virtual ground to the circuitry when in the standby mode.

22. The method of claim 21, further comprising:
   restoring power to the circuitry following the system being in the standby mode; and
   transferring the stored data value from the cross-coupled inverters to the circuitry after power is restored to the circuitry.

23. The method of claim 22, further comprising:
   asserting a signal to activate the transistor to a conduction mode while restoring power to the circuitry.

24. The method of claim 19, further comprising using the data value stored in the cross-coupled inverters as a checkpoint to record a state of the system.

25. The method of claim 19, further comprising sensing the stored data value in the circuitry using transistors having the first gate-oxide thickness.

* * * * *

UNITED STATES PATENT AND TRADEMARK OFFICE
CERTIFICATE OF CORRECTION

PATENT NO. : 6,639,827 B2 Page 1 of 1
APPLICATION NO. : 10/097202
DATED : October 28, 2003
INVENTOR(S) : Lawrence T. Clark et al.

It is certified that error appears in the above-identified patent and that said Letters Patent is hereby corrected as shown below:

Column 2, Line 54     Delete "mater" and insert -- matter --

Signed and Sealed this

Fifteenth Day of January, 2008

JON W. DUDAS
*Director of the United States Patent and Trademark Office*